US005781636A

United States Patent [19]

Tai

[11] Patent Number: 5,781,636

[45] Date of Patent: Jul. 14, 1998

[54] METHOD AND APPARATUS FOR GENERATING SOUNDS WITH TREMOLO AND VIBRATO SOUND EFFECTS

[75] Inventor: Chiao-Yen Tai, Hsinchu, Taiwan

[73] Assignee: United Microelectronics Corporation, Hsinchu, Taiwan

[21] Appl. No.: 635,505

[22] Filed: Apr. 22, 1996

[51] Int. Cl.[6] .......... H03G 3/00

[52] U.S. Cl. .......... 381/62; 84/629

[58] Field of Search .......... 381/61, 62, 63; 84/630, 629, 626

[56] References Cited

U.S. PATENT DOCUMENTS

| | | | |
|---|---|---|---|
| 4,021,613 | 5/1977 | Kennedy | 381/62 |
| 4,957,030 | 9/1990 | Suzuki | 84/629 |
| 5,010,799 | 4/1991 | Tanaka et al. | 84/629 |
| 5,050,216 | 9/1991 | Hanzawa et al. | 381/62 |
| 5,333,203 | 7/1994 | Diaz | 381/63 |
| 5,386,529 | 1/1995 | Kondo | 381/63 |

*Primary Examiner*—Wing F. Chan
*Assistant Examiner*—Vivian Chang
*Attorney, Agent, or Firm*—Ladas & Parry

[57] ABSTRACT

A digital sound generator with tremolo and vibrato sound effects is provided, which comprises: a source memory for storing different types of wave-tables; a first adder for adding a constant frequency and a step-varied frequency waveform to produce a tremulous frequency waveform; a register for storing a frequency address parameter from a central processing unit; an address generator for generating a frequency address in response to the frequency address parameter to said source memory to determine the type of signal waveform being outputted, so that said source memory produces a tremolo by playing the tremulous frequency waveform in the determined signal waveform; an amplitude generator for generating the amplitude of a normal sound; a second adder for adding the amplitude from the amplitude generator and an amplitude-variant signal from the source memory to produce a vibrato; and a synthesizer for synthesizing the tremolo and the vibrato to produce a sound with a special sound effect.

16 Claims, 5 Drawing Sheets

METHOD AND APPARATUS FOR GENERATING SOUNDS WITH TREMOLO AND VIBRATO SOUND EFFECTS

BACKGROUND OF THE INVENTION

1. Field of The Invention

This invention relates to a digital sound generator. In particular, the present invention relates to a digital sound generator with special sound effects, and more particularly to a method and an apparatus for generating tremolo and vibrato sounds.

2. Description of Background Art

Generally, a digital sound generator includes a frequency generator for generating frequencies of different sound signals, an amplitude generator for generating amplitudes of the different sound signals, and a signal synthesizing unit for synthesizing the frequency and the amplitude of a desired sound. The waveforms of fundamental frequencies stored in the frequency generator are generated by using pulse code modulation (PCM), which includes the steps of sampling and quantizing sound signals to generate digital signals, encoding the digital signals to digital pulse signals and storing the digital pulse signals in an internal memory device. The data stored in the memory device are sequentially fetched out and transformed to analog signals after filtering so as to generate fundamental frequency waveforms. However, the frequency generator of the digital sound generator is merely capable of generating a single frequency of a certain type of waveform. On the other hand, the digital sound generator employs a plurality of sound tracks for respectively processing different frequencies, and outputs the sound after mixing.

Two types of sound typically generated include "tremolo" and "vibrato" sounds.

The term "tremolo" means that the rapid reiteration of a musical tone or of alternating tones of a chord so as to produce a tremulous effect, i.e., a tremolo is a signal including a constant frequency component and a variable frequency component. Referring to FIG. 1(A)–1(E), which illustrates the frequency waveform of a signal with a constant frequency in FIG. 1(A) and the voltage waveform of a signal with a constant frequency in FIG. 1(D). FIG. 1(B) illustrates the waveform of a time-dependent variable frequency. The waveform of a modulated signal shown in FIG. 1(C) is produced by adding the frequency waveforms shown in FIG. 1(A) and FIG. 1(B). The voltage waveform of the modulated signal is illustrated in FIG. 1(E) which includes a constant frequency component and a variable frequency component.

Furthermore, the term "vibrato" refers to a slightly tremulous effect imparted to vocal or instrumental tones for added warmth and expressiveness and consisting of slight and rapid variations in the pitch of the tone being produced, in other words, a vibrato is a signal provided with a voltage amplitude of slight and rapid variations such as sinusoidal waves. Referring to FIGS. 2(A)–2(C), there is illustrated an exemplified amplitude waveform of a normal sound in FIG. 2(A). FIG. 2(B) illustrates an amplitude waveform of a signal with slight and rapid variations. A vibrato, as shown in FIG. 2(C), can be produced by modulating the sound waveform of FIG. 2(A) with the signal of FIG. 2(B).

The method for generating tremolo and vibrato described above is accomplished by modulating the frequency and amplitude of a sound respectively with variable frequency and amplitude-variant signals. However, these digital sound generators are too complex due to the use of a variable frequency generator, if they are intended to generate tremolo or vibrato effects.

Even though a variable frequency generator is employed in a digital sound generator, this kind of digital sound generator can only generate a sound with a certain kind of sound effect under a special architecture. That is, the architecture of a digital sound generator must be modified when a different sound effect is desired. As such, the apparatus for generating the variable frequency and amplitude-variant signals has such drawbacks as complexity and lack of variability. Namely, the conventional apparatus has a complex and inflexible architecture so that it is difficult to produce sounds with various sound effects.

OBJECTS AND SUMMARY OF THE INVENTION

It is therefore an object of the present invention to provide an improved technique which overcomes the drawbacks and disadvantages associated with the aforementioned digital sound generators.

It is another object of the present invention to provide a digital sound generator with tremolo and vibrato sound effects.

Still another object of the present invention is to provide a multiplexer for the digital sound generator of this invention to change the degree of tremolo and/or vibrato sound effects.

According to the present invention, a source memory stores different types of wave-tables. A first adder adds a constant frequency and a step-varied frequency waveform to produce a tremulous frequency waveform. A register stores a frequency address parameter supplied by a central processing unit. An address generator generates a frequency address to the source memory in response to the frequency address parameter from the register, so that the source memory produces a tremolo by playing the tremulous frequency waveform in the determined type of signal waveform. An amplitude generator generates the amplitude of a normal sound. A second adder adds the amplitude from the amplitude generator and an amplitude-variant signal from the source memory to produce a vibrato. A synthesizer synthesizes the tremolo and the vibrato to produce a sound with a special sound effect.

Various other objects, advantages and features of the present invention will become readily apparent from the ensuing detailed description, and the novel features will be particularly pointed out in the appended claims.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 3:
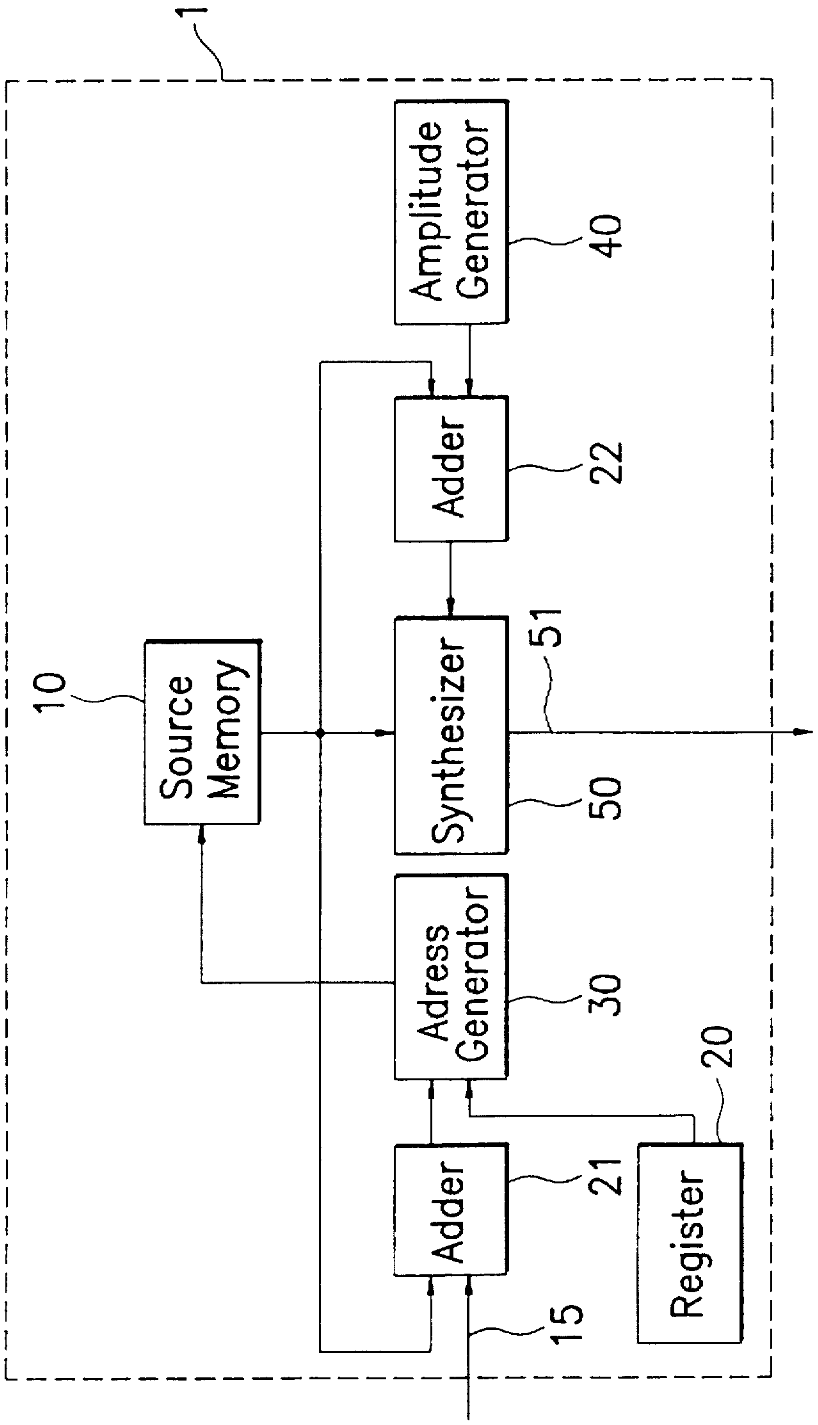
FIG. 3 schematically illustrates a block diagram of the digital sound generator according to an embodiment of this invention.

Reference is now made to FIG. 3, which illustrates an architecture of digital sound generator 1 in accordance with the present invention. Digital sound generator 1 includes address generator 30 for generating a frequency-varied parameter in response to a starting signal supplied by a central processing unit (not shown); source memory 10 for storing different types of wave-tables, the source memory 10 outputting a step-varied frequency waveform stored in the wave-tables according to the frequency-varied parameter; first adder 21 for adding a constant frequency and the step-varied frequency waveform to produce a tremulous frequency waveform as shown in FIG. 1(C); register 20 for storing a frequency address parameter supplied by the central processing unit, whereby the address generator 30 generates a frequency address to the source memory 10 in response to the frequency address parameter from the register 20 to determine the signal waveform (e.g., sinusoidal wave or triangular wave, etc.) being outputted, so that the source memory 10 produces a tremolo in accordance with the signal waveform and the tremulous frequency waveform; amplitude generator 40 for generating the amplitude of a normal sound without any sound effect; second adder 22 for adding the amplitude from the amplitude generator 40 and an amplitude-variant signal supplied by the source memory 10 to produce a vibrato; synthesizer 50 for synthesizing the tremolo and the vibrato to produce a sound with a special sound effect.

Figure 1A:
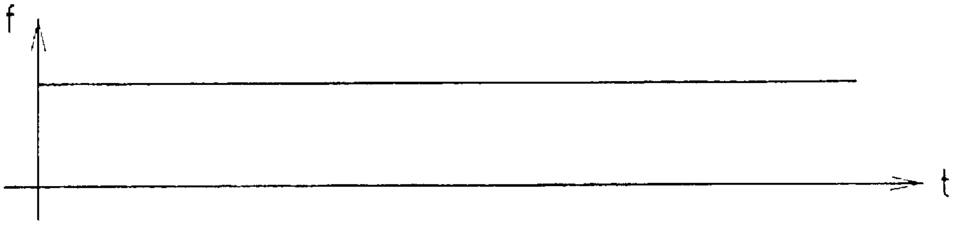
FIGS. 1(A)–1(E) show the modulated waveforms of vibrato sound effects according to an embodiment of this invention.
Figure 1B:
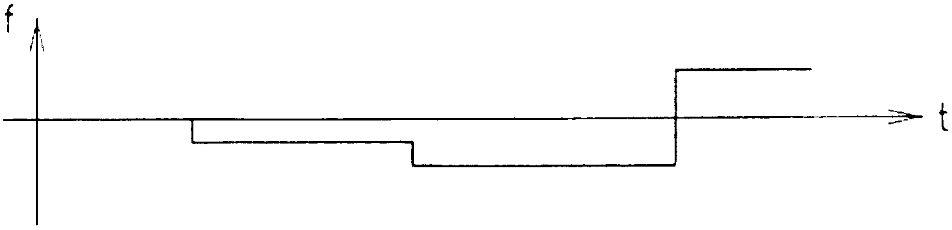
Figure 1C:
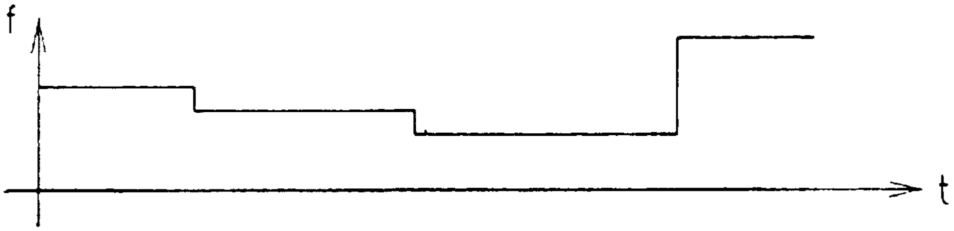
Figure 1D:
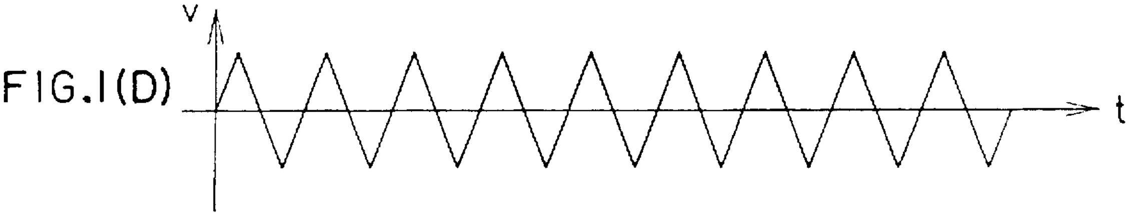
Figure 1E:
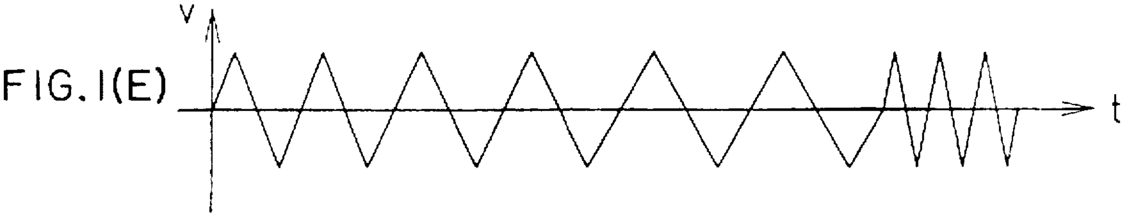
Figure 2A:
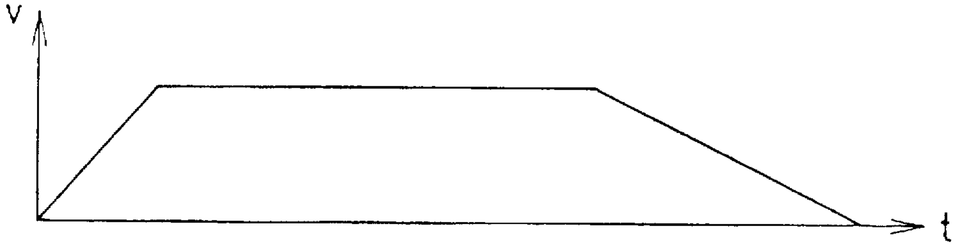
FIGS. 2(A)–2(C) show the modulated waveforms of tremolo sound effects according to an embodiment of this invention.
Figure 2B:
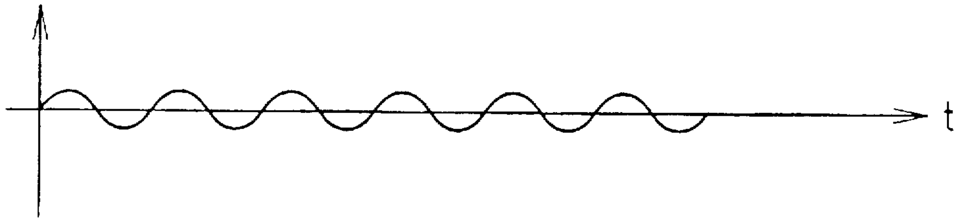
Figure 2C:
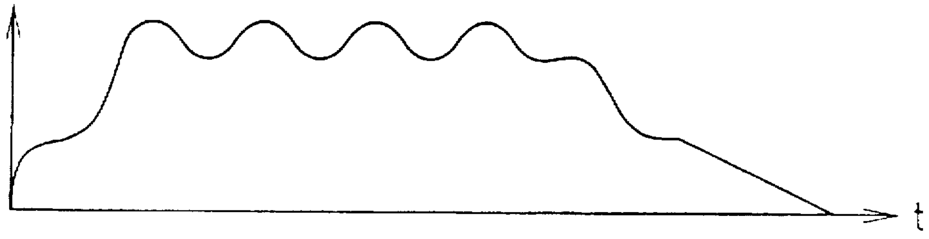

It should be noted that the different types of wave-tables stored in the source memory 10 include a plurality of step-varied frequency waveforms, for example the waveform shown in FIG. 1(B), and a plurality of amplitude-variant signals such as the sinusoidal signal shown in FIG. 2(B).

According to the present invention, a starting signal issued by the central processing unit is transmitted to the address generator 30 through the first adder 21. The address generator 30 outputs a step-varied frequency parameter to the source memory 10 in response to the starting signal. The source memory 10 transmits a step-varied frequency waveform to the first adder 21. A constant frequency issued by the central processing unit also inputs to the first adder 21 through the input terminal 15. Thereafter the first adder 21 adds the step-varied frequency waveform and the constant frequency to produce a tremulous frequency waveform to the address generator 30. Meanwhile a frequency address parameter is outputted to the address generator 30 from the register 20. Thus the address generator 30 produces a frequency address to the source memory 10 to determine the signal waveform being outputted. And a tremulous signal produced by playing the tremulous frequency waveform in the determined type of signal waveform is outputted to the synthesizer 50.

On the other hand, the amplitude generator 40 generates an amplitude of a normal sound to the second adder 22. At the same time, an amplitude signal issued by the central processing unit is transmitted to the address generator 30 through the first adder 21, and the address generator 30 also outputs an amplitude-variant address to the source memory 10. Therefore the source memory 10 outputs an amplitude-variant signal to the second adder 22. Thereafter the second adder 22 adds the amplitude from the amplitude generator 40 and the amplitude-variant signal from the source memory 10 to produce a vibrato to the synthesizer 50. As a result, the synthesizer 50 produces a sound signal with a special sound effect by synthesizing the tremulous frequency and the vibrato and outputs the sound signal through the output terminal 51.

Figure 4:
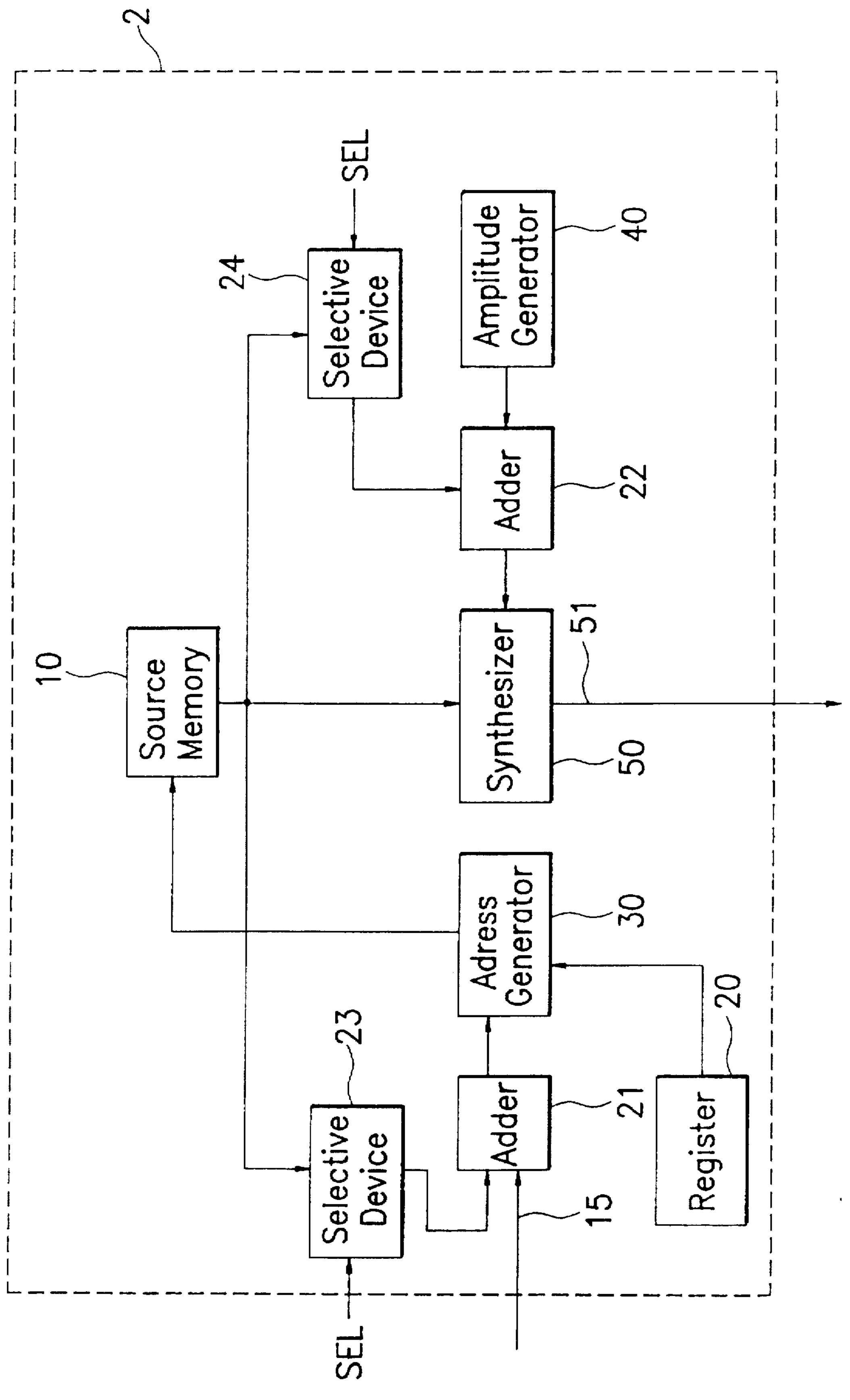
FIG. 4 schematically illustrates a block diagram of the digital sound generator according to another embodiment of this invention.

Referring to FIG. 4 which illustrates another preferred embodiment of the present invention. In this embodiment, digital sound generator 2 has two selective devices (e.g., demultiplexers) 23 and 24 have been added to the architecture of the digital sound generator of the previous embodiment, digital sound generator 1. The two selective devices 23 and 24 have the same architecture. The first selective device 23 is positioned between the source memory 10 and the first adder 21. Also the second selective device 24 is positioned between the source memory 10 and the second adder 22. The two selective devices are used to control the mixing ratio of frequency and amplitude of a sound, that is, to control the output level of tremulous effects of a sound.

Figure 5:
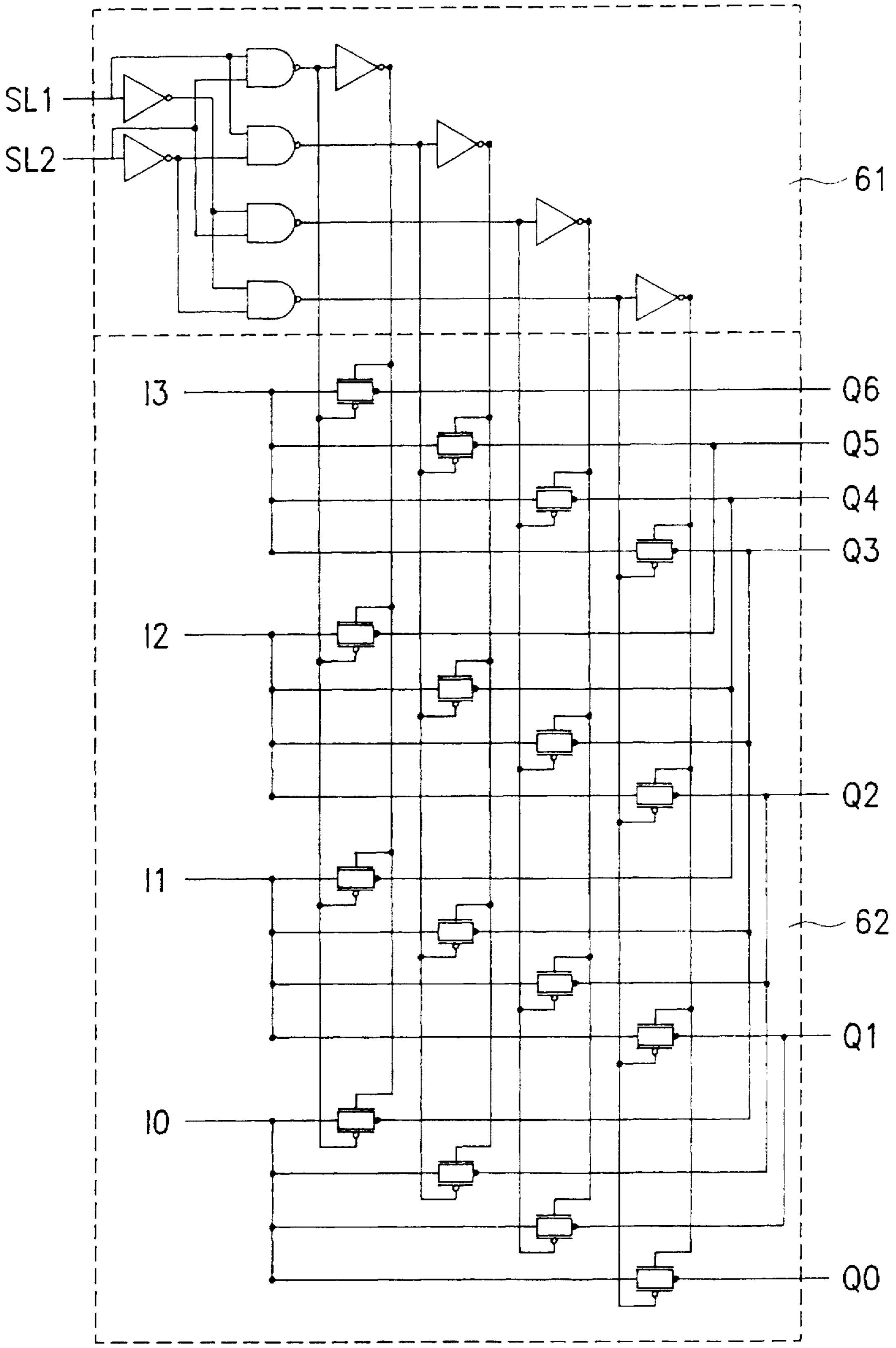
FIG. 5 schematically illustrates a circuit diagram of the mixing-ratio selective device shown in FIG. 4.

Referring to FIG. 5, each of the selective devices includes a control portion 61, and a selective portion 62. Furthermore, the control portion 61 includes some logical gates, e.g., inverters and NAND gates. The selective portion 62 consists of a plurality of switches (e.g., transmission gate). The control portion 61 receives a selective signal SEL including two binaries SL1 and SL2 supplied by the central processing unit and issues control signals to the selective portion 62. The control portion 61 receives four data binaries I0–I3, and outputs seven binaries Q0–Q6 in response to the control signals. It should be understood that the bit number of the selective signal SEL is dependent on the bit number of the data from the source memory, for example, the bit width of the selective signal is 3 when the bit number of the data is in a range of 5–8 bits. It also should be noted that the source memory outputs a 4-bit data, but both of the first adder and the second adder receive a 7-bit data in the two embodiments described above. However, in the embodiment of FIG. 3, the 4-bit data cascades with 3 null bits in a fixed configuration. For example, 4-bit data 0100 can be transformed to 0010000, that is, the 4-bit data is addressed at the third–sixth bit of the 7-bit data. On the other hand, the position of the 4-bit data can be adjusted in the embodiment of FIG. 4 by changing the selective signal SEL. For example, the 4-bit data 0100 will be transformed to 0010000 while the selective signal SEL is 10 (i.e., SL1=1 and SL2=0). When the selective signal SEL is 01, the 4-bit data 0100 will be transformed to 0001000. In other words, the ratios of frequency and amplitude can be tuned in response to the selective signal.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiments, those alternatives which have been discussed above and all equivalents thereto.

What is claimed is:

1. A digital sound generator with tremolo and vibrato sound effects comprising:

a source memory for storing different types of wave-tables;

a first adder for adding a constant frequency and a step-varied frequency waveform to produce a tremulous frequency waveform;

a register for storing a frequency address parameter;

an address generator for generating a frequency address in response to the frequency address parameter to said source memory to determine the type of signal waveform being outputted, so that said source memory produces a tremolo by playing the tremulous frequency waveform in the determined signal waveform;

an amplitude generator for generating the amplitude of a normal sound;

a second adder for adding the amplitude from said amplitude generator and an amplitude-variant signal from said source memory to produce a vibrato; and a synthesizer for synthesizing the tremolo and the vibrato to produce a sound with a special sound effect.

2. The digital sound generator as claimed in claim 1 wherein said address generator outputs the frequency address with different step values in response to a variable step value.

3. The digital sound generator as claimed in claim 1 further comprising a first ratio selective circuit connected the output terminal of said source memory to said first adder for selecting the degree of the tremolo effect.

4. The digital sound generator as claimed in claim 1 further comprising a second ratio selective circuit connected the output terminal of said source memory to said second adder for selecting the degree of the vibrato effect.

5. The digital sound generator as claimed in claim 3 wherein said first ratio selective circuit is a demultiplexer.

6. The digital sound generator as claimed in claim 4 wherein said second ratio selective circuit is a demultiplexer.

7. A digital sound generator with tremolo sound effects comprising:

a source memory for storing different types of wave-tables;

an adder for adding a constant frequency parameter and a step-varied frequency waveform to produce a tremulous frequency waveform;

a register for storing a frequency address parameter;

an address generator for generating a frequency address in response to the frequency address parameter to said source memory to determine the type of signal waveform being outputted, so that said source memory produces a tremolo by playing the tremulous frequency waveform in the determined signal waveform; and a synthesizer for synthesizing the tremolo from said source memory and the amplitude from an amplitude generator to produce a sound with a special sound effect.

8. The digital sound generator as claimed in claim 7 wherein said address generator outputs the frequency address with different step values in response to a variable step value.

9. The digital sound generator as claimed in claim 7 further comprising a first ratio selective circuit connected the output terminal of said source memory to said first added for selecting the degree of tremolo effect.

10. A digital sound generator with vibrato sound effects comprising:

a source memory for storing different types of wave-tables;

a register for storing a frequency address parameter;

an address generator for generating a frequency address to said source memory in response to the frequency address parameter, so that said source memory outputs a frequency waveform;

an amplitude generator for generating the amplitude of a normal sound;

an adder for adding the amplitude from said amplitude generator and an amplitude-variant signal from said source memory to produce a vibrato; and a synthesizer for synthesizing the frequency waveform from said source memory and the vibrato from said adder to produce a sound with a special sound effect.

11. The digital sound generator as claimed in claim 10 wherein said address generator outputs the frequency address with different step values in response to a variable step value.

12. The digital sound generator as claimed in claim 10 further comprising a second ratio selective circuit connected the output terminal of said source memory to said second adder for selecting the degree of vibrato effect.

13. A method for generating sounds with tremolo and vibrato sound effects, comprising the steps of:

storing a plurality of wave-tables including step-varied frequency waveforms and amplitude-variant signals in a source memory;

inputting selective signals to said source memory to address said plurality of wave-tables for outputting a step-varied frequency waveform to a first adder and an amplitude-variant signal to a second adder;

inputting a constant frequency to said first adder so that the constant frequency and the step-varied frequency waveform are added to produce a tremulous frequency waveform to said source memory;

inputting an amplitude of a sound to said second adder so that the amplitude and the amplitude-variant signal are added to produce a vibrato to a synthesizer;

generating a tremolo supplied by said source memory in response to the tremulous frequency waveform, and inputting the tremolo to said synthesizer; and using said synthesizer to synthesize the vibrato and the tremolo to produce a sound with special sound effects.

14. The method for generating sounds with tremolo and vibrato sound effects as claimed in claim 13 further comprising the step of using a first selective means between said source memory and said first adder to change the tremulous parameter so as to change the magnitude of the tremolo.

15. The method for generating sounds with tremolo and vibrato sound effects as claimed in claim 13 further comprising the step of using a second selective means between said source memory and said second adder to change the amplitude-variant signal so as to change the magnitude of the vibrato.

16. The method for generating sounds with tremolo and vibrato sound effects as claimed in claim 13 further comprising the steps of:

using a first selective means between said source memory and said first adder to change the tremulous parameter so as to change the magnitude of the tremolo; and using a second selective means between said source memory and said second adder to change the amplitude-variant signal so as to change the magnitude of the vibrato.

* * * * *